(12) United States Patent
Yang et al.

(10) Patent No.: US 6,278,617 B1
(45) Date of Patent: Aug. 21, 2001

(54) SHIELD FOR ELECTRONIC DEVICE

(75) Inventors: Chric Kuo-Wei Yang, Taichung; Jen-Jou Chang, Yung-Ho, both of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/291,805

(22) Filed: Apr. 14, 1999

(30) Foreign Application Priority Data

Oct. 6, 1998 (TW) .................................................. 87216520

(51) Int. Cl.[7] ..................................................... H05K 9/00
(52) U.S. Cl. .......................... 361/818; 361/800; 361/816; 361/801; 361/802; 361/740; 361/741; 361/756; 361/759
(58) Field of Search ..................................... 361/683, 686, 361/753, 756, 758, 788, 796, 799, 800–802, 740, 741, 747, 759, 816, 818; 174/35 R, 35 GC, 51; 439/607

(56) References Cited

U.S. PATENT DOCUMENTS

| | | | |
|---|---|---|---|
| 5,640,309 | * | 6/1997 | Carney et al. ........................ 361/801 |
| 5,856,632 | * | 1/1999 | Bostrom et al. ................. 174/35 GC |
| 5,959,244 | * | 9/1999 | Mayer ............................. 174/35 GC |

* cited by examiner

Primary Examiner—Jayprakash N. Gandhi
Assistant Examiner—Phuong T. Vu
(74) Attorney, Agent, or Firm—Wei Te Chung

(57) ABSTRACT

A shield adapted to be fit into an opening defined in a casing of an electronic device to protect the electronic device from electromagnetic interference, includes a shielding panel dimensioned to be received in the opening of the casing. The shielding panel has outward flanges contacting support flanges extending from a periphery of the opening of the casing for retaining the shield in the opening. The outward flanges of the shielding panel form at least one retaining tongue extending therefrom and receivable in a gap defined in the support flanges of the casing for securely retaining the shield in the opening.

3 Claims, 7 Drawing Sheets

SHIELD FOR ELECTRONIC DEVICE

BACKGROUND OF THE INVENTION

1. Field of the Invention

The present invention generally relates to an electrical shield for protecting an electronic device from electromagnetic interference, and in particular to a shield that is securely retained in an electronic device.

2. The Prior Art

Electrical shields are commonly mounted inside an electronic device, such as a computer, for shielding and protecting a circuit board of the electronic device from external electromagnetic interference. FIG. 7 of the attached drawings shows a conventional shield designated by reference numeral 5. The shield 5 comprises a panel having outward flanges 51 for fitting in an opening defined in a casing of an electronic device thereby securing the shield 5 in the casing. The shield 5 has openings 52 for accommodating connectors mounted on a circuit board of the electronic device.

Since the shield 5 is only retained in the opening of the casing by means of engagement between the flanges 51 and the opening, the shield 5 may not be securely fixed to the casing. Furthermore, a gap exists between the shield 5 and the opening of the casing. Thus, the engagement between the shield and the opening is further weakened.

It is thus desirable to have a shield that overcomes the problem of the prior art.

SUMMARY OF THE INVENTION

Accordingly, an object of the present invention is to provide a shield comprising retaining tongues extending through and retained in a gap defined in a casing of an electronic device thereby securely retaining the shield in the casing.

To achieve the above object, a shield in accordance with the present invention comprises a shielding panel dimensioned to be received in an opening defined in a casing of an electronic device for protecting the electronic device from electromagnetic interference. The shielding panel has outward flanges contacting support flanges extending from a periphery of the opening of the casing for retaining the shield in the opening. The outward flanges of the shielding panel form at least one retaining tongue extending therefrom and receivable in a gap defined in the support flanges of the casing for securely retaining the shield in the opening.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
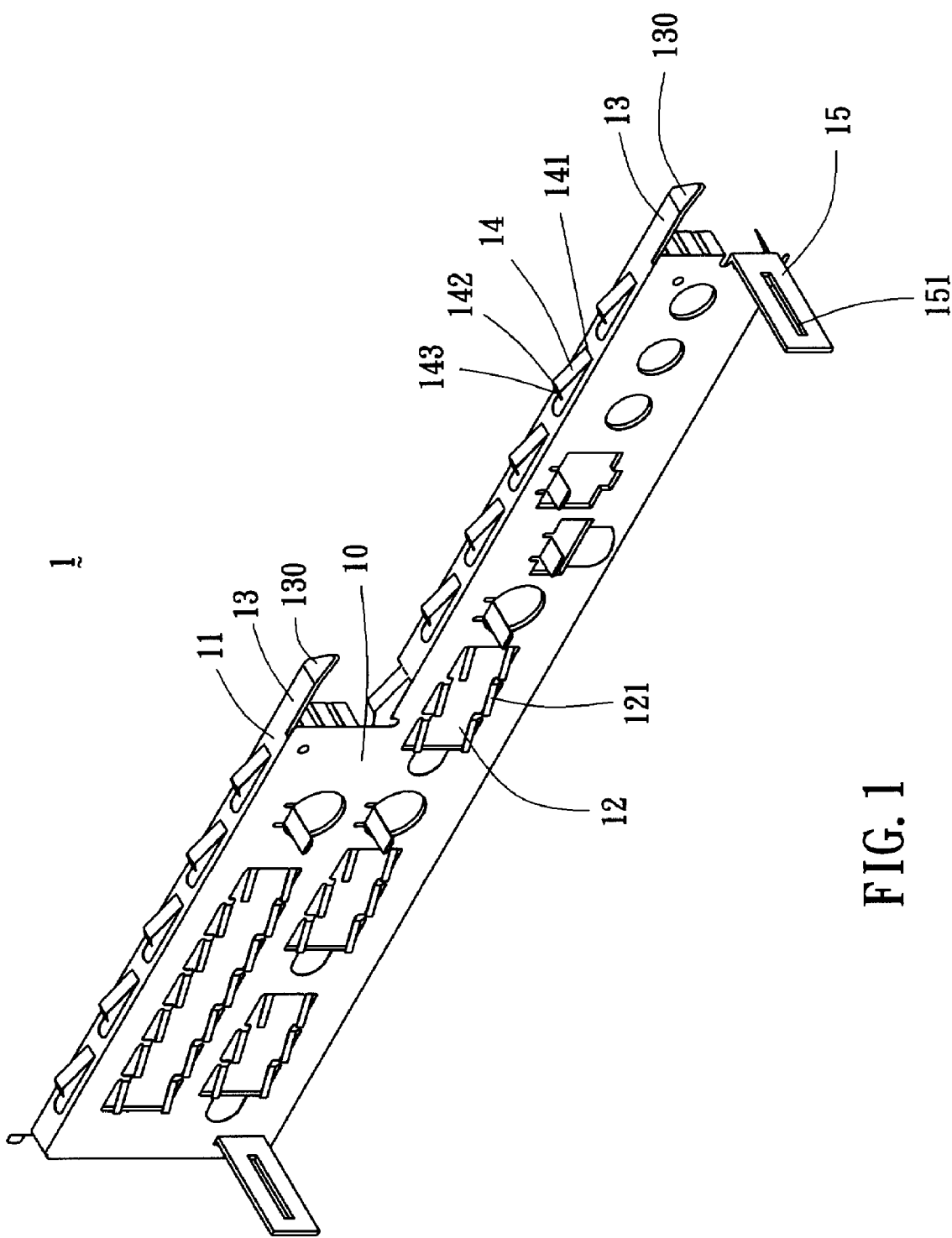
FIG. 1 is a perspective view of a shield constructed in accordance with the present invention.
Figure 2:
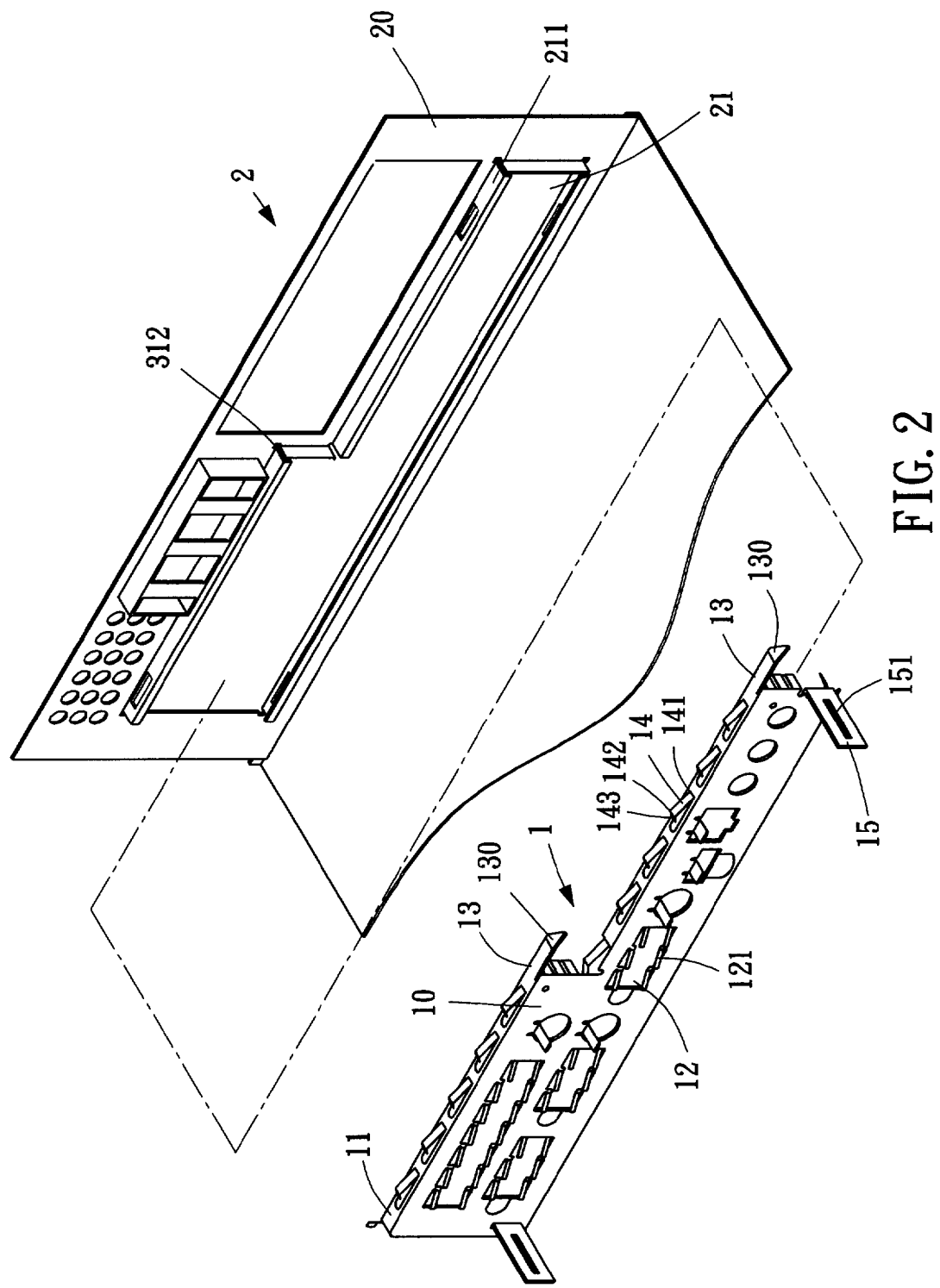
FIG. 2 is a perspective view of the shield and a casing of an electronic device.
Figure 3:
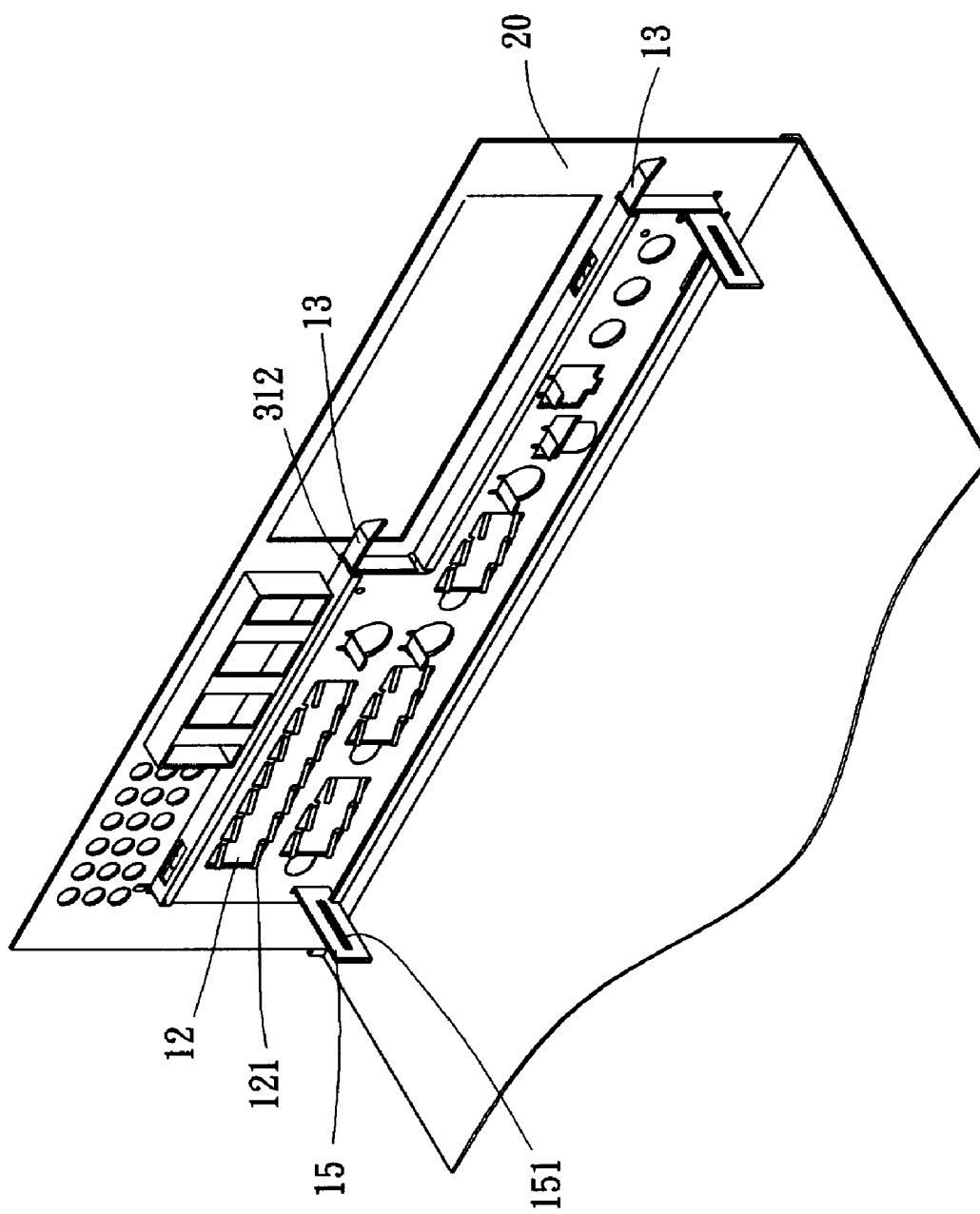
FIG. 3 is a perspective view of the shield mounted to the casing of the electronic device.

Referring to the drawings and in particular to FIGS. 1, 2, and 3, wherein a shield adapted to be mounted in an electronic device for protecting a circuit board (not shown) of the electronic device from electromagnetic interference is shown, the shield 1 comprises a shielding panel 10 configured to fit into an opening 21 defined in a casing 20 of the electronic device 2.

The shielding panel 10 has outward flanges 11 that guide the insertion of the shielding panel 10 into the opening 21 of the casing 20. Each outward flange 11 contacts a corresponding support flange 211 extending from a periphery of the opening 21 for ensuring proper protection against electromagnetic interference.

In the embodiment illustrated, the support flanges 211 of the casing 20 define guide channels for receiving and retaining the outward flanges 11 of the shield 1 and guiding insertion of the shield 1 into the opening 21 of the casing 20.

The outward flanges 11 of the shield 1 are provided with V-shaped resilient tabs 14 each having a connecting portion 141 fixed to the outward flange 11 and a free end 143. A bent portion 142 is formed between the connecting portion 141 and the free end 143. The resilient tabs 14 ensure proper engagement between the support flanges 211 of the casing 20 and the shielding panel 10.

The shielding panel 10 comprises two board support arms 15 extending from opposite sides thereof. Each board support arm 15 defines an elongate slot 151 therein. The slot 151 extends in a direction substantially normal to the outer panel 10 from a remote end to a proximal end thereof for receiving a portion of an edge of the circuit board thereby retaining the circuit board between the board support arms 15. Mounting the shielding member 10 in the opening 21 of the casing 20 also attaches the circuit board to the casing 20.

The shielding panel 10 also comprises a plurality of openings 12 for receiving connectors (not shown) mounted on the circuit board. Preferably, the openings 12 are provided with resilient flanges 121 extending from peripheries thereof for electrically engaging the connectors.

Figure 4:
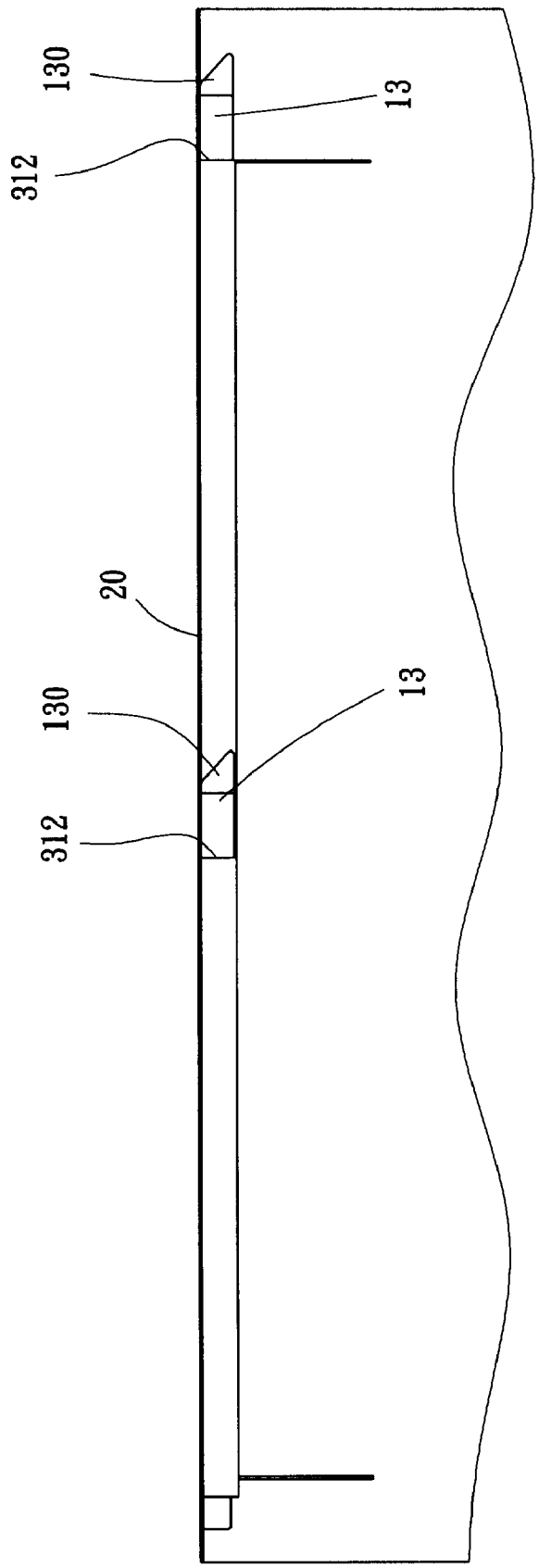
FIG. 4 is a top view of FIG. 3.
Figure 5:
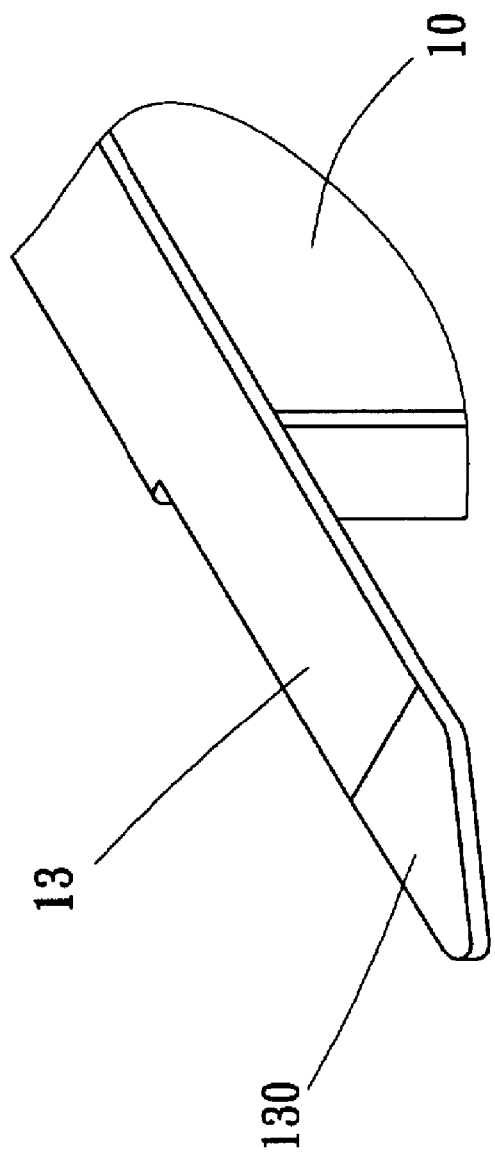
FIG. 5 is a perspective view of a retaining tongue extending from the shield of the present invention.

The outward flanges 11 of the shielding panel 10 comprise at least one retaining tongue 13 extending therefrom for being fit into a corresponding gap 312 defined in the support flanges 211 of the casing 20 thereby providing a secure engagement between the outward flanges 11 of the shielding panel 10 and the support flanges 211 of the casing 20. Thus, the shield 1 is securely retained in the opening 21 of the casing 20, as seen in FIGS. 3 and 4. Referring to FIG. 5, the retaining tongue 13 has a tapered free end 130 which facilitates insertion of the retaining tongue 13 into the gap 312 of the casing 20.

Figure 6:
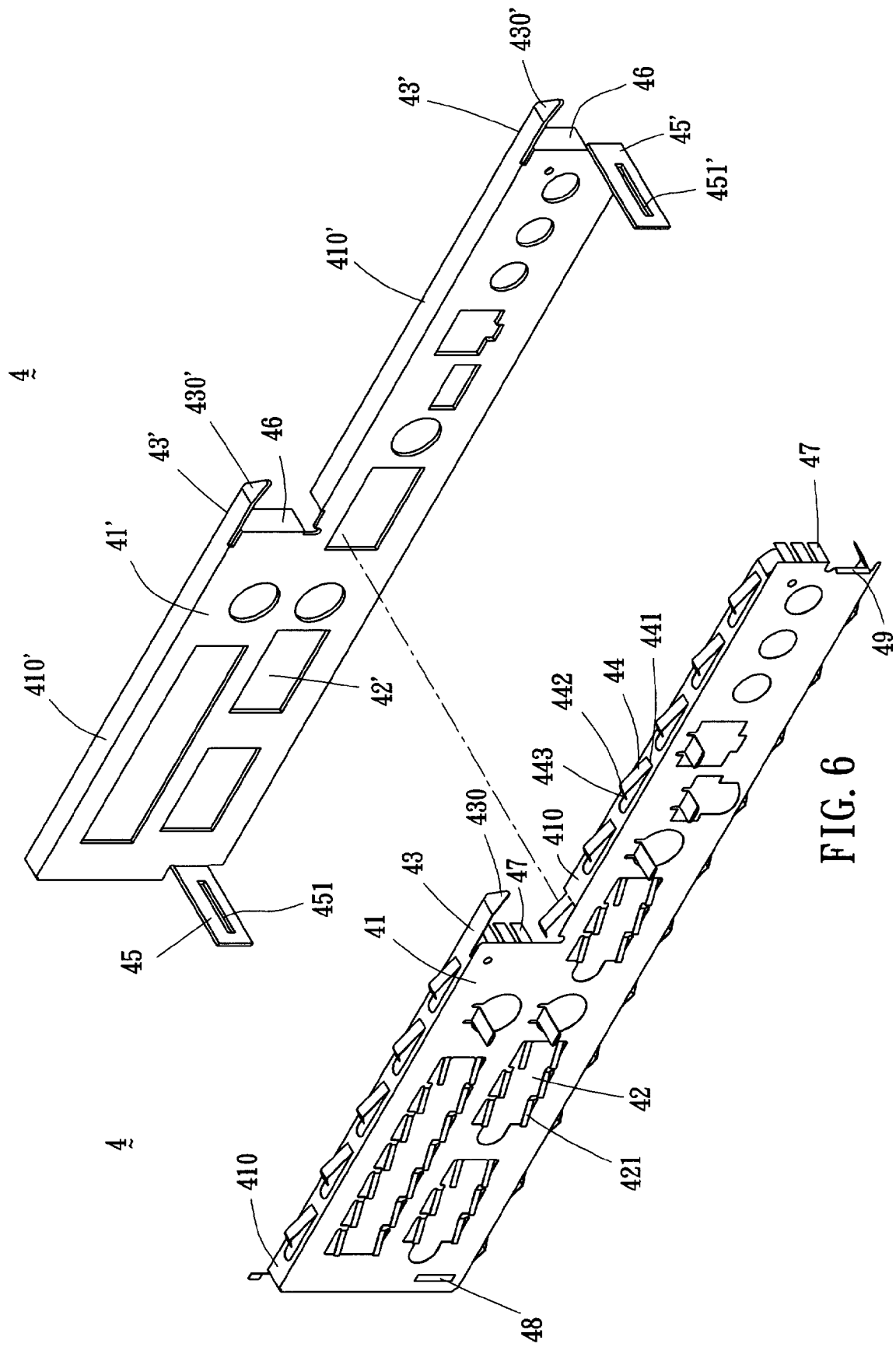
FIG. 6 is an exploded view of a shield constructed in accordance with a second embodiment of the present invention.
Figure 7:
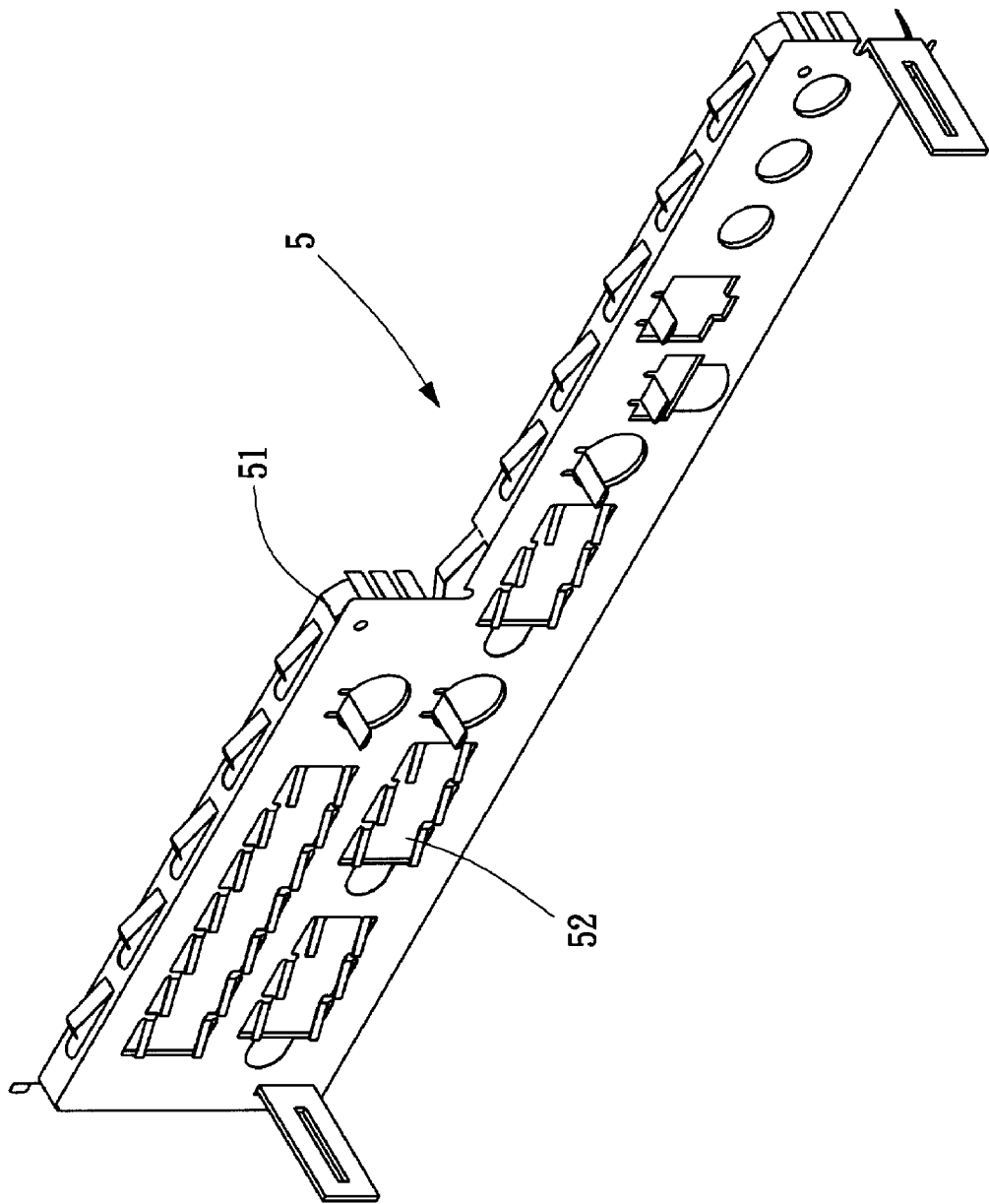
FIG. 7 is a perspective view of a conventional shield.

FIG. 6 shows another embodiment of the shield in accordance with the present invention. The shield of the second embodiment, designated by reference numeral 4, comprises an inner shielding panel 41 attached to an outer shielding panel 41'. The outer shielding panel 41' is made from a thick metal blank for providing a desired mechanical strength, while the inner shielding panel 41 is made from a thin metal blank for facilitating formation of resilient members 421, 44 by means of pressing.

The outer shielding panel 41' has two board support arms 45, 45' extending from opposite sides thereof. Each board support arm 45, 45' defines an elongate slot 451, 451' therein for receiving a portion of an edge of a circuit board (not shown) therein.

The inner shielding panel 41 defines a slot 48 through which the board support arm 45 of the outer shielding panel 41' extends and an inward flange 49 abutting against and supporting the board support arm 45' of the outer shielding panel 41'.

Both the outer shielding panel 41' and the inner shielding panel 41 define openings 42', 42 aligned with each other for receiving connectors (not shown) mounted on the circuit board. Resilient flanges 421 extend from peripheries of the openings 42 of the inner shielding panel 41 for electrical engaging with the corresponding connectors.

The outer shielding panel 41' forms outward flanges 410', 46. The inner shielding panel 41 forms outward flanges 410, 47 to be fit over the corresponding outward flanges 410', 46 of the outer shielding panel 41' for retaining the inner shielding panel 41 on the outer shielding panel 41' thereby forming the shield 4. The outward flanges 46, 47 of the outer and inner shielding panels 41', 41 abut against each other for positioning purposes.

The outward flanges 410, 410' are fit into the opening 21 of the casing 20 and the outward flanges 410 of the inner shielding panel 41 contact the support flanges 211 of the casing 20 for retaining the shield 4 in the opening 21. The outward flanges 410 of the inner shielding panel 41 are provided with V-shaped resilient tabs 44 each having a connecting portion 441 fixed to the outward flange 410 and a free end 443. A bent portion 442 is formed between the free end 443 and the connecting portion 441 for ensuring proper engagement with the support flange 211 of the casing 20.

The outward flanges 410' of the outer shielding panel 41' comprise at least one retaining tongue 43' which is fit into the gap 312 of the support flanges 211 of the casing 20. The shield 4 is thus securely retained in the opening 21 of the casing 20. The retaining tongue 43' has a tapered free end 430' for facilitating insertion of the retaining tongue 43' into the gap 312.

Preferably, the inner shielding panel 41 also comprises a retaining tongue 43 corresponding to and overlapping the retaining tongue 43' of the outer shielding panel 41'. The retaining tongue 43 of the inner shielding panel 41 also has a tapered end 430 corresponding to and overlapping the tapered end 430' of the retaining tongue 43' of the outer shielding panel 41'.

Although the present invention has been described with reference to preferred embodiments thereof, it is apparent to those skilled in the art that a variety of modifications and changes may be made without departing from the scope of the present invention which is intended to be defined by the appended claims.

What is claimed is:

1. A shielding assembly for an electronic device, the shielding assembly comprising a shield and a casing, the shield being fit into an opening defined in the casing to protect the electronic device from electromagnetic interference, the shield comprising:

a shielding panel received in the opening of the casing, the shielding panel comprising first outward flanges contacting support flanges extending from a periphery of the opening of the casing for retaining the shield in the opening, the first outward flanges of the shielding panel comprising at least one retaining tongue extending therefrom and fit into a gap defined in the support flanges of the casing for securely retaining the shield in the opening;

a secondary panel comprising second outward flanges fit over the first outward flanges of the shielding panel, the secondary panel comprising resilient tabs formed on the second outward flanges thereof and engaged with the support flanges of the casing;

wherein the shielding panel comprises two board support arms extending therefrom for supporting and retaining a circuit board of the electronic device, the secondary panel defining a slot through which one of the board support arms extends, the secondary panel further comprising a side flange abutting against and supporting the other board support arm.

2. The shield and casing assembly as claimed in claim 1, wherein each resilient tab comprises a V-shaped member fixed to the second outward flanges of the secondary panel.

3. The shield and casing assembly as claimed in claim 1, wherein the shielding panel defines first openings therein adapted to accommodate connectors mounted on a circuit board, the second panel defining second openings aligned with the first openings of the shielding panel for accommodating the connectors, the first openings of the shielding panel comprising resilient flanges extending from peripheries thereof for engaging the corresponding connectors.

* * * * *